(12) United States Patent
Somasekhar et al.

(10) Patent No.: US 8,283,771 B2
(45) Date of Patent: Oct. 9, 2012

(54) MULTI-DIE INTEGRATED CIRCUIT DEVICE AND METHOD

(75) Inventors: Dinesh Somasekhar, Portland, OR (US); Tanay Karnik, Portland, OR (US); Jianping Xu, Portland, OR (US); Yibin Ye, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 273 days.

(21) Appl. No.: 12/215,761

(22) Filed: Jun. 30, 2008

(65) Prior Publication Data
US 2009/0321893 A1 Dec. 31, 2009

(51) Int. Cl.
*H01L 23/04* (2006.01)
*H01L 23/52* (2006.01)

(52) U.S. Cl. ............... 257/698; 257/691; 257/E23.011; 257/E23.039; 257/E23.067

(58) Field of Classification Search .......... 257/690–700, 257/713–777, E23.011, E23.039, E23.067
See application file for complete search history.

(56) References Cited

U.S. PATENT DOCUMENTS

| | | | | |
|---|---|---|---|---|
| 5,432,999 A | * | 7/1995 | Capps et al. | 438/109 |
| 7,446,420 B1 | * | 11/2008 | Kim | 257/777 |
| 7,453,150 B1 | * | 11/2008 | McDonald | 257/774 |
| 7,466,028 B1 | * | 12/2008 | Yu et al. | 257/774 |
| 2002/0101760 A1 | * | 8/2002 | Naji | 365/158 |
| 2002/0155692 A1 | * | 10/2002 | Kong | 438/613 |
| 2005/0046002 A1 | | 3/2005 | Lee et al. | |
| 2005/0286286 A1 | * | 12/2005 | Saito et al. | 365/63 |
| 2007/0023887 A1 | * | 2/2007 | Matsui | 257/686 |

FOREIGN PATENT DOCUMENTS

| | | |
|---|---|---|
| JP | 2005-209776 | 8/2005 |
| JP | 200660072 | 3/2006 |
| JP | 2007287023 | 11/2007 |

OTHER PUBLICATIONS

Office Action received for Chinese Patent Application No. 200910139648.6, mailed on Jul. 30, 2010, 6 pages of Chinese Office Action including 2 pages of English Translation.
Office Action received for Chinese Patent Application No. 200910139648.6, mailed on Apr. 13, 2011, 7 pages of Chinese Office Action including 3 pages of English Translation.
Office Action received for Korean Patent Application No. 2009-0058782, mailed on Jan. 11, 2011, 2 pages of English Translation.
Notice of Allowance mailed Mar. 2, 2012 for Chinese Patent Application No. 10139648.6.
Notice of Allowance mailed Jul. 7, 2011 for Korean Patent Application No. 2009-0058782.
Third Office Action mailed Jan. 25, 2012 for Chinese Patent Application No. 2009 10139648.6.
First Office Action mailed Jun. 26, 2012 for Japanese Patent Application No. 2009153602; received from Japanese Associate Jul. 9, 2012.

* cited by examiner

*Primary Examiner* — Michael Lebentritt
*Assistant Examiner* — Karen Kusumakar
(74) *Attorney, Agent, or Firm* — Blakely, Sokoloff, Taylor & Zafman LLP

(57) ABSTRACT

In some embodiments, provided is an integrated circuit with a first die coupled to a second die. The second die has through-silicon vias disposed through it to provide power references to the first die. The through-silicon vias are laterally re-positionable without inhibiting circuit sections in the second die.

17 Claims, 3 Drawing Sheets

MULTI-DIE INTEGRATED CIRCUIT DEVICE AND METHOD

BACKGROUND

As shown in FIG. 1, two (or multiple) dies can be stacked in what are commonly referred to as three-dimensional integrated circuit packages to provide dense interconnection (e.g., 3000 or more interconnects) between a first die (e.g., processor) 105 and a second die (e.g., memory) 107, which provides increased bandwidth between the dies. In order to provide signal and power supply lines to the dies (especially to the first, upper die), however, through silicon vias (TSVs) 109 coming up through the second (lower) die may be employed.

In some embodiments, the first (top) die is a processor, while the second (lower) die comprises a dense memory device. Bumps on the lower die connect to a package substrate, which couples the package to external connections such as to a motherboard. FIG. 2A is an exemplary high-level layout diagram for a memory die 107. The memory is organized into individual banks (Mem. Bank 205). The memory die also includes peripheral I/O circuit blocks and logic, clock, and timing circuit blocks in the middle. The through silicon vias are processed from the back side of the memory die and land on pre-assigned contact pads, e.g., at the interface with the upper (processor) die.

FIG. 2B shows one possible way of positioning the contact pads for TSVs landing across the entire memory die. Unfortunately, as seen from the figure, the TSVs come through memory bank sections and end up at various asymmetric or irregular places. Accordingly, improved solutions are desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
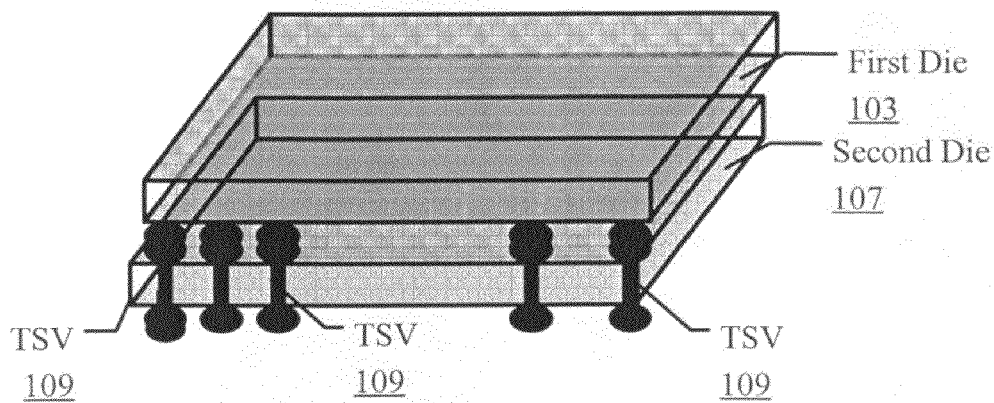
FIG. 1 is a perspective cross-sectional view of a conventional three-dimensional integrated circuit (IC) package with two dies.
Figure 2A:
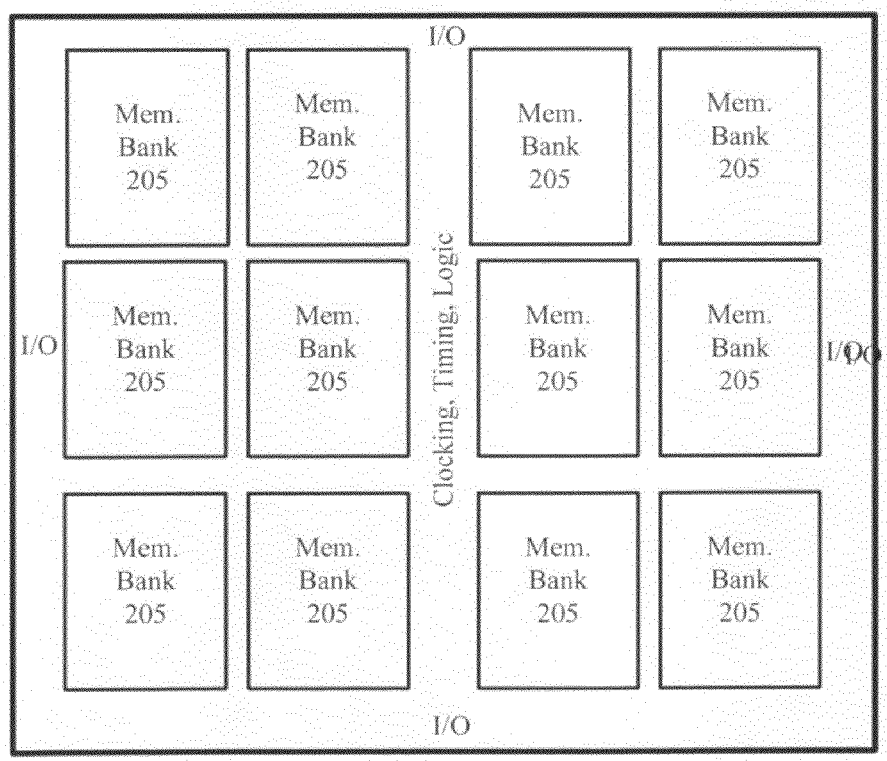
FIG. 2A is a layout diagram for memory banks in a memory die for the IC of FIG. 1.
Figure 2B:
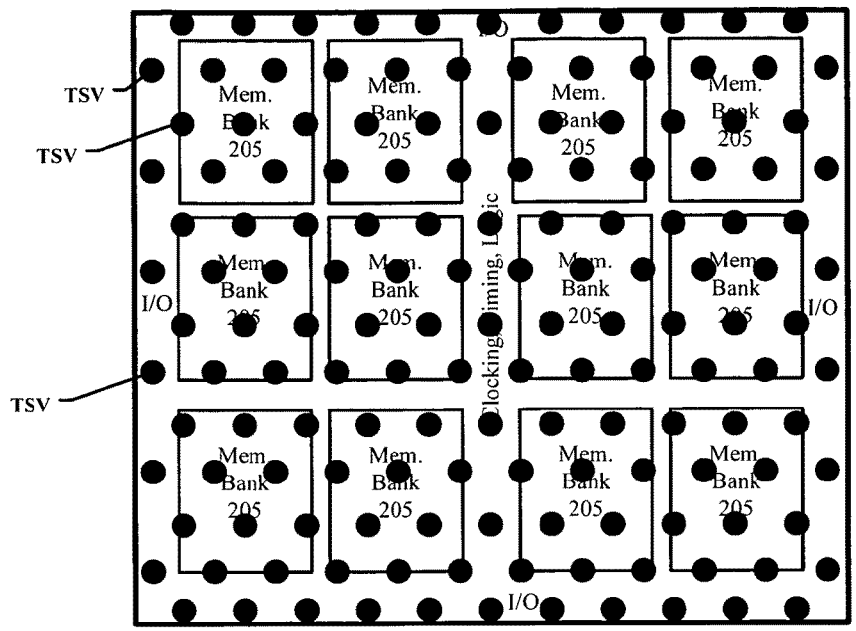
FIG. 2B shows the layout diagram of FIG. 2A showing locations for through silicon vias (TSVs) used to couple signals to the two dies in the IC package.
Figure 3:
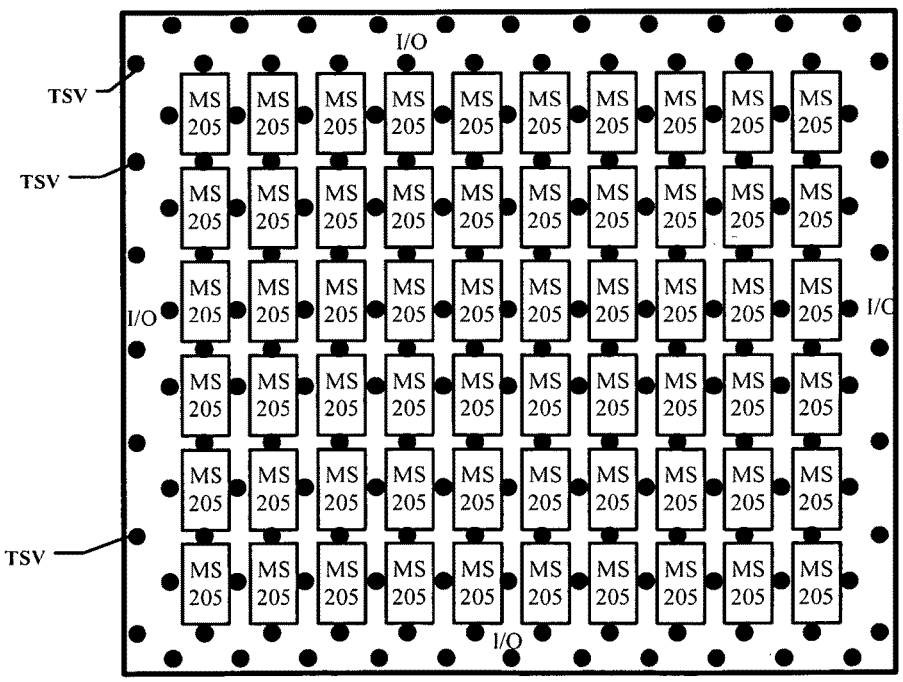
FIG. 3 is a layout diagram for a memory die with TSVs in accordance with some embodiments.

FIG. 3 shows a layout for some embodiments of a memory die (chip) with memory sections 205 and TSVs. The memory sections (arrays) are disposed around the TSVs. Relative to embodiments discussed earlier, the bank sizes are reduced, and the TSVs (or through vias) are placed inside the empty spaces as shown. One advantage of this approach is the space savings for logic, clock and timing circuits (also distributed in the spaces but not indicated in this diagram).

In some situations, however, the circuit (e.g., memory) design may evolve even as the package configuration is being designed and in many cases, it is desirable for TSV placement specifications to change at the same time. For example, in a 3D stack, TSV specifications on one die may be dictated by the other die whose specifications may also be changing. This means that memory banks, and in particular, the memory cell arrays, may need to accommodate TSVs within their sections. Unfortunately, memories are generally designed to be dense. Hence memory organization cannot be easily compromised such as when TSV locations are to be moved, which can be intrusive and at times, a hindrance to memory array design.

Figure 4A:
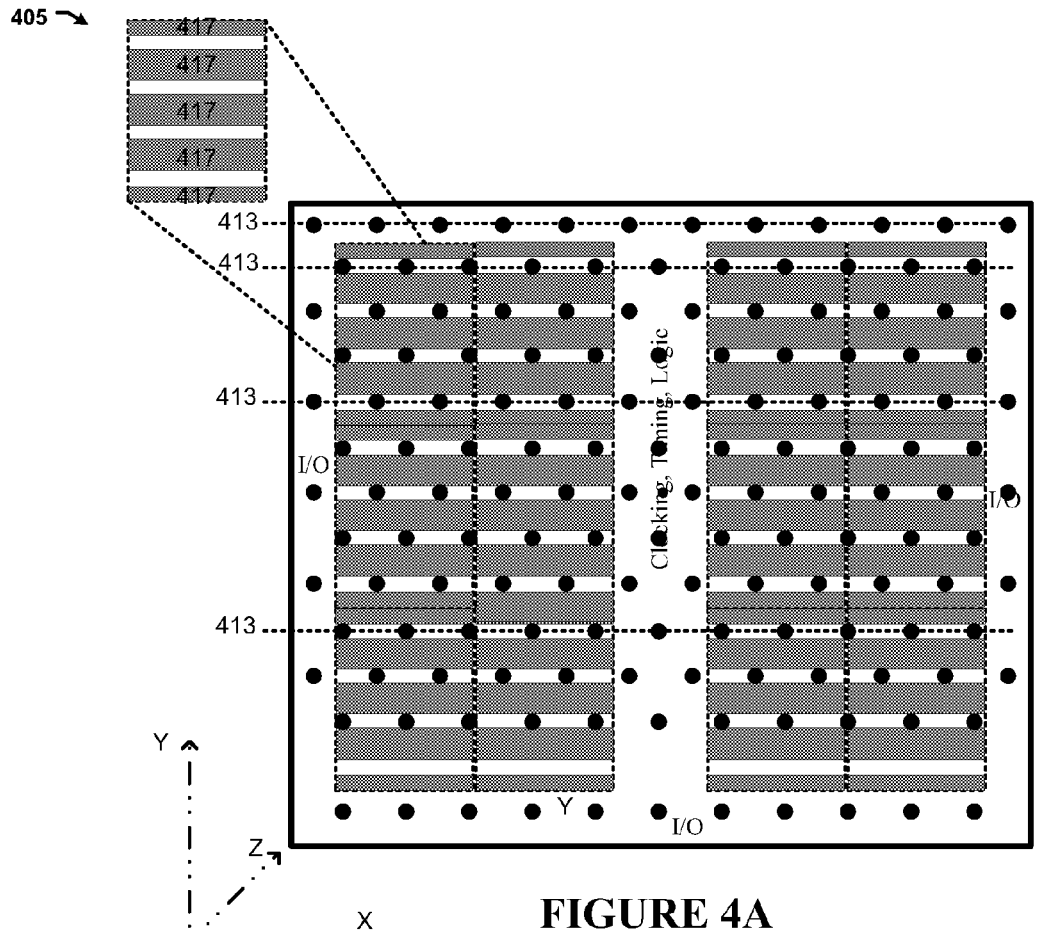
FIG. 4A is a layout diagram for a memory die with TSVs in accordance with additional embodiments.
Figure 4B:
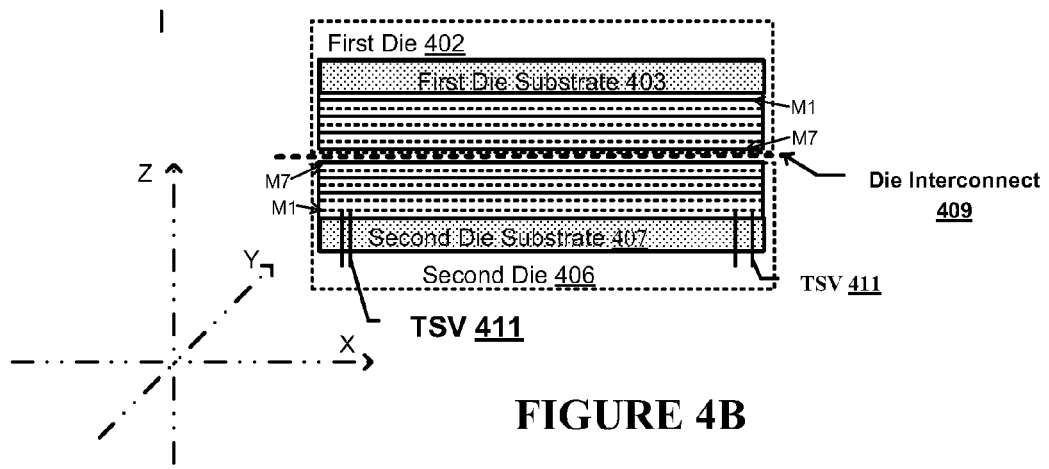
FIG. 4B is a side view of an IC package with a first die and a second memory die as in FIG. 4A in accordance with some embodiments.

FIGS. 4A and 4B depict another approach for implementing TSVs in a multi-die IC stack. FIG. 4A is a layout diagram for a memory die with TSVs, in accordance with some embodiments, and FIG. 4B shows a side view of the IC package. (Note that as with all of the drawings in this disclosure, the banks and TSVs are not drawn to scale. The actual TSV landing zones are typically smaller than depicted.) As can be seen, the memory banks 405 (twelve banks are shown in this depiction) are parsed into spaced apart sections 417. With the banks arranged as shown, the spaces between the sections align to form tracks 413 (not all of which are referenced for brevity sake) to contain the TSVs. In the depicted embodiment, the tracks 413 are spaced apart from and aligned in parallel (along the X-axis) with one another. (Note that as used herein, the term "track" is used to describe a space, e.g., a longitudinal shape such as an elongated rectangle. It does not necessarily refer to any physical structure.)

With this arrangement, a TSV can be accommodated anywhere in the tracks. that is, they figuratively can "slide" within the tracks so that designers have greater flexibility to laterally move vias, even during the latter IC package development stages. (From a design standpoint, the TSVs are "slidable" but they don't actually move once fabricated.) This means that the memory bank sections 417 can also be moved along their "tracks" at any location without materially impacting three-dimensional process development or TSV positioning specification changes.

FIG. 4B shows the first and second dies 402, 406 coupled together at a die interconnect 409 through numerous, e.g., in excess of 3,000, interconnect contacts. The first and second dies have substrates (403, 407, respectively) upon where their circuits are formed and from there, they each have metallization layers, M1 to M7 in the depicted embodiment, for interconnecting circuit elements within and between the dies and to distribute signals and power references from the TSVs. The dies 402, 406 are coupled together so that their metal layers are adjacent to one another for more efficient interconnectivity.

Typically, each metal layer comprises spaced apart, metal lines, running in the same direction. Usually, the lines in a given layer are orthogonal, relative to the lines in adjacent layers so that the metal lines in layers next to each other generally cross over one another. (This isn't always the case; however, as discussed below, for example, both the M1 and M2 layers in the second die 406 are in the Y direction.) In FIG. 4B, this is reflected with the use of dashed and solid lines. That is, the dashed lines represent a layer having lines aligned with the Y axis, while the solid lines represent metal layers with lines aligned with the X axis.

In the depicted embodiment, the M1 layer serves as a contact layer and facilitates the TSV landing pads. The M2 lines are used to couple desired TSV contacts in a given line together with each other. For example, VSS contacts in a line may be coupled with each other and VCC contacts in a line may be coupled to each other. The empty areas around the TSV pads can be used for repeaters, logic, timing, clock buffers, etc. The M3 lines can then be used to couple separated sections in a memory bank together and in some embodiments, spaces (or gaps) are maintained within M3 lines to allow for TSV connections to come up from the M2 lines, e.g., to be coupled to the first die 402.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An apparatus comprising:
    a first die coupled to a second die; and
    vias disposed through the second die to provide power references to the first die, the vias being positioned along a first axis without overlapping circuit sections in the second die,
    wherein the vias are disposed along lines in a direction of the first axis, the lines being parallel to and between two or more tracks having the circuit sections in the second die, and wherein the vias being on either side of the two or more tracks,
    wherein the second die has at least first, second, and third metal line layers, the first metal line layer being closer to circuitry in the second die, followed by the second and third metal line layers, and
    wherein the first metal line layer is used to provide contact pads for the vias, the second layer is used to couple like vias together, and the third layer is used to interconnect portions of circuit sections within the second die with one another.

2. The apparatus of claim 1, wherein the second die circuit sections are in parallel with the first axis.

3. The apparatus of claim 1, wherein the second die is a memory chip.

4. The apparatus of claim 1, wherein the vias are each aligned along an associated line that is parallel with the first axis.

5. The apparatus of claim 1, wherein the circuit sections are spaced apart memory sections organized into one or more memory banks.

6. The apparatus of claim 1, wherein lines in the third metal line layer have gaps to accommodate connectivity from the second metal line layer to pass there through.

7. The apparatus of claim 1, wherein lines in the first and third metal line layers are aligned in the same direction and are aligned orthogonally with the lines in the second metal line layer.

8. The apparatus of claim 1, wherein the first die has spaced apart metal line layers and the first and second dies are mounted next to each other such that the metal line layers from the first die are adjacent with those from the second die.

9. A chip comprising:
    a substrate with circuit components;
    a metal layer having a plurality of through-silicon-via (TSV) landing pads for passing through the substrate, the TSV landing pads disposed along lines that are parallel to two or more tracks having the circuit components, wherein the TSV landing pads are positioned between and on either side of the two or more tracks without overlapping the two or more tracks; and
    at least first, second, and third metal line layers, the first metal line layer being closer to the circuit components in the chip, followed by the second and third metal line layers, and
    wherein the first metal line layer is used to provide contact pads for the TSVs, the second layer is used to couple like TSVs together, and the third layer is used to interconnect portions of circuit components with one another.

10. The chip of claim 9, wherein the circuit components are organized into memory banks.

11. The chip of claim 9, wherein at least some of the TSV landing pads are coupled to metal lines in a second chip.

12. The chip of claim 9, wherein the circuit components are organized into memory bank sections that are spaced apart from each other within a given bank.

13. An integrated circuit (IC) package comprising:
a processor die coupled to a memory die in a stack configuration, the memory die having memory banks each including spaced apart memory bank sections, the memory bank sections arranged inside two or more tracks; and
through-silicon-vias (TSVs) disposed through the memory die to provide power references to the processor and memory dies from outside of the IC package, the TSVs being positioned between and on either side of the two or more tracks without overlapping the two or more tracks,
wherein the memory die has at least first, second, and third metal line layers, the first metal line layer being closer to circuitry in the memory die, followed by the second and third metal line layers, and
wherein the first metal line layer is used to provide landing pads for the TSVs, the second metal line layer is used to couple like TSVs together, and the third metal line layer is used to interconnect portions of the memory bank sections within the memory die with one another.

14. The IC package of claim 13, wherein the memory bank section axes are parallel to the TSV tracks.

15. The IC package of claim 13, wherein lines in the third metal line layer have gaps to accommodate connectivity from the second metal line layer to pass there through to one or more metal lines in the processor die.

16. The IC package of claim 13, wherein lines in the first and third metal line layers are aligned in the same direction and are aligned orthogonally with the lines in the second metal line layer.

17. The IC chip of claim 13, wherein the processor die has spaced apart metal line layers and first and second dies are mounted next to each other such that the metal line layers from the processor die are adjacent with those from the memory die.

* * * * *